United States Patent
Yamazaki et al.

(10) Patent No.: US 10,661,486 B2
(45) Date of Patent: May 26, 2020

(54) IMPRINT SYSTEM AND METHOD OF MANUFACTURING ARTICLE

(71) Applicant: CANON KABUSHIKI KAISHA, Tokyo (JP)

(72) Inventors: Takuro Yamazaki, Utsunomiya (JP); Tomomi Funayoshi, Utsunomiya (JP); Hiromitsu Yamaguchi, Yokohama (JP); Masayoshi Fujimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 991 days.

(21) Appl. No.: 14/927,547

(22) Filed: Oct. 30, 2015

(65) Prior Publication Data
US 2016/0129614 A1 May 12, 2016

(30) Foreign Application Priority Data
Nov. 6, 2014 (JP) .................................. 2014-226406

(51) Int. Cl.
*B29C 43/58* (2006.01)
*G03F 7/00* (2006.01)

(52) U.S. Cl.
CPC ............ *B29C 43/58* (2013.01); *G03F 7/0002* (2013.01)

(58) Field of Classification Search
None
See application file for complete search history.

(56) References Cited

U.S. PATENT DOCUMENTS

| 6,341,841 B1 | 1/2002 | Shimada et al. |
| 8,560,977 B2 | 10/2013 | Matsuoka et al. |
| 8,827,400 B2 | 9/2014 | Kodama |
| 2010/0097590 A1* | 4/2010 | Schumaker ............ B82Y 10/00 355/53 |

(Continued)

FOREIGN PATENT DOCUMENTS

| CN | 1398724 A | 2/2003 |
| JP | 2011159764 A | 8/2011 |

(Continued)

OTHER PUBLICATIONS

Office Action issued in Taiwanese Appln. No. 104133032 dated Jan. 12, 2017. English translation provided.

(Continued)

*Primary Examiner* — Matthew J Daniels
*Assistant Examiner* — Mohammad M Ameen
(74) *Attorney, Agent, or Firm* — Rossi, Kimms & McDowell LLP

(57) ABSTRACT

The present invention provides an imprint system including a processing unit configured to perform an imprint process, the processing unit including a dispenser configured to supply a droplet of an imprint material onto a substrate, a library configured to manage a plurality of different maps each indicating at least one of a supply position and a supply amount for a droplet to be supplied on the substrate from the dispenser, and a control unit configured to select one map to be used in the imprint process from the plurality of maps managed in the library based on information about a change of a result of the imprint process caused by a temporal change of at least one of a mold and the dispenser.

18 Claims, 11 Drawing Sheets

(56) References Cited

U.S. PATENT DOCUMENTS

| | | | | |
|---|---|---|---|---|
| 2010/0233377 A1* | 9/2010 | Aoki | ............... | B29C 59/022 |
| | | | | 427/355 |
| 2012/0274006 A1* | 11/2012 | Matsumoto | ......... | B29C 43/021 |
| | | | | 264/571 |
| 2013/0010020 A1* | 1/2013 | Kodama | ............ | B82Y 10/00 |
| | | | | 347/10 |
| 2014/0065735 A1* | 3/2014 | Koshiba | ............ | H01L 22/10 |
| | | | | 438/14 |

FOREIGN PATENT DOCUMENTS

| | | | |
|---|---|---|---|
| JP | 2011194278 A | | 10/2011 |
| JP | 2012114157 A | | 6/2012 |
| JP | 2012234901 A | | 11/2012 |
| JP | 5214683 B2 | | 6/2013 |
| JP | 2013-193326 | * | 9/2013 |
| TW | 201144895 A1 | | 12/2011 |

OTHER PUBLICATIONS

Office Action issued in Japanese Appln. No. 2014-226406 dated Aug. 17, 2018.

* cited by examiner

F I G. 14
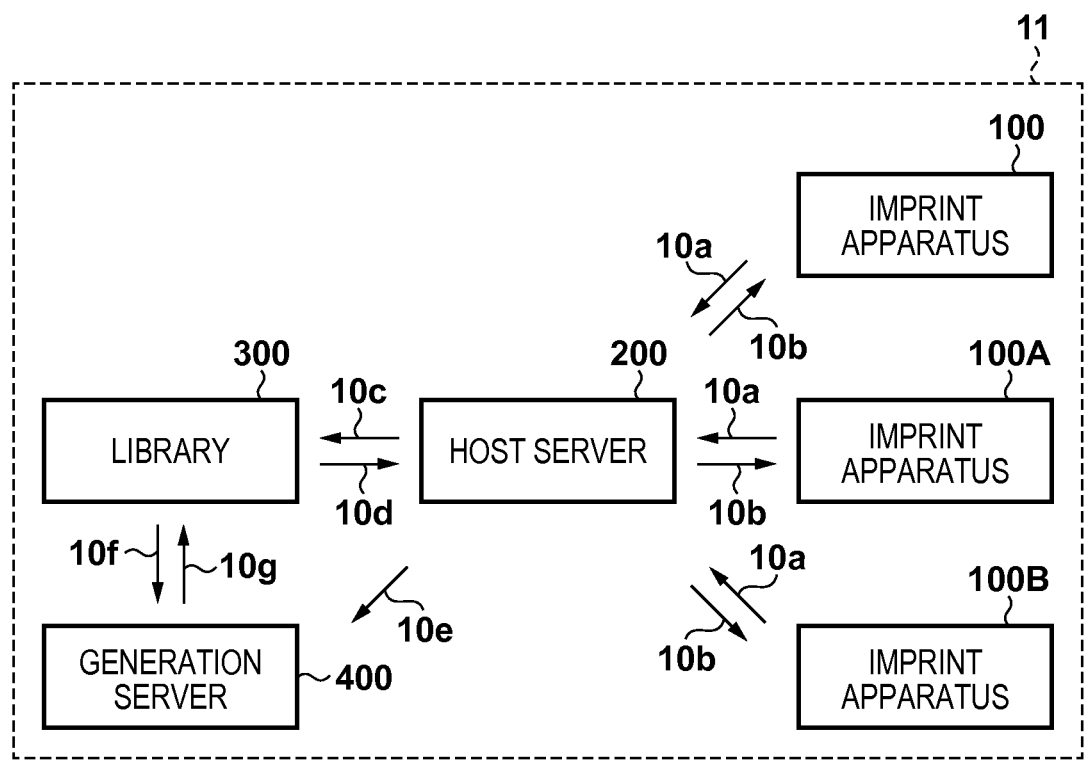

IMPRINT SYSTEM AND METHOD OF MANUFACTURING ARTICLE

BACKGROUND OF THE INVENTION

Field of the Invention

The present invention relates to an imprint system and a method of manufacturing an article.

Description of the Related Art

An imprint technique is a technique capable of transferring nanoscale micropatterns, and has received attention as a nanolithography technique for mass production of semiconductor devices and magnetic storage media. An imprint apparatus using the imprint technique cures a resin (imprint material) on a substrate in a state in which a pattern-formed mold (original) contacts the resin, and separates the mold from the cured resin, thereby forming the pattern on the substrate. Such an imprint apparatus generally employs, as a resin curing method, a photo-curing method of curing a resin on a substrate by irradiation with light such as ultraviolet light.

When supplying a resin onto a substrate (coating a substrate with a resin), the imprint apparatus forms the array of droplets of the resin on the substrate by using, for example, an inkjet method. The imprint apparatus presses the mold against the resin (droplets) on the substrate to fill the pattern (concave portion) of the mold with the resin. In the imprint apparatus, however, problems such as a defect of a pattern formed on a substrate and an abnormality of the residual layer thickness (RLT) are generated owing to the difference and manufacturing variations of the pattern of the mold, operational variations of the apparatus, and the like. This makes it difficult to form a high-quality pattern.

To solve these problems, Japanese Patent No. 5214683 and Japanese Patent Laid-Open No. 2012-114157 propose techniques of optimizing a map (resin coating pattern, imprint recipe, or drop recipe) indicating the supply positions of droplets of a resin on a substrate. Japanese Patent No. 5214683 discloses a method of creating an imprint recipe in consideration of the filling amount of a resin in the pattern of a mold, a residual layer thickness to be formed on a substrate, the positions of shot regions and edges on the substrate, the concave/convex distribution on the underlayer (substrate), and variations of processing dimensions in a post-process. Japanese Patent Laid-Open No. 2012-114157 discloses a method of creating a drop recipe creation support database in which drop recipes each having a smallest number of defects are selected and collected for respective circuit blocks constituting a semiconductor integrated circuit.

As the imprint apparatus repeats an imprint process, a resin that cannot be completely separated from the pattern, that is, concave portion of a mold is gradually deposited (attached), and the shape (concave/convex shape) of the pattern of the mold changes. Therefore, it is common practice to, after the end of the imprint process by a predetermined number of times, detach the mold from the apparatus, clean it, attach again the cleaned mold to the apparatus, and repeat the imprint process. Note that the concave/convex shape of the mold includes, for example, the pattern dimension, the volume ratio (duty cycle) of concave and convex portions, the depth of the concave portion (height of the convex portion), the concave/convex taper angle, and the surface roughness (Ra).

It is known that, when the mold is cleaned, its pattern is worn and the shape of the pattern is changed. By repeating the imprint process, a temporal change is generated in the shape of the pattern of the mold owing to attachment of the resin or wear by cleaning. To prolong the service life of the mold, it is effective to decrease the cleaning frequency of the mold. In this case, a new map needs to be generated in order to suppress generation of a pattern defect and a residual layer thickness abnormality arising from the resin attached to the pattern of the mold. This is because a pattern defect and a residual layer thickness abnormality are highly likely to occur when the imprint process is repeated using the same map with respect to a temporal change of the shape of the pattern of the mold.

However, as described above, the creation of the map needs to consider the positions of shot regions and edges on a substrate, the concave/convex distribution on an underlayer, processing dimensions in a post-process, and the like, in addition to the shape of the pattern of the mold. Creation of a new map requires a predetermined time, and the imprint process needs to be stopped during the creation, decreasing the productivity (availability) of the imprint apparatus.

SUMMARY OF THE INVENTION

The present invention provides an imprint system advantageous for productivity.

According to one aspect of the present invention, there is provided an imprint system that performs an imprint process of forming a pattern of an imprint material on a substrate by using a mold, including a processing unit configured to perform the imprint process, the processing unit including a dispenser configured to supply a droplet of the imprint material onto the substrate, a library configured to manage a plurality of different maps each indicating at least one of a supply position and a supply amount for a droplet to be supplied on the substrate from the dispenser, and a control unit configured to select one map to be used in the imprint process from the plurality of maps managed in the library based on information about a change of a result of the imprint process caused by a temporal change of at least one of the mold and the dispenser.

Further aspects of the present invention will become apparent from the following description of exemplary embodiments with reference to the attached drawings.

BRIEF DESCRIPTION OF THE DRAWINGS

FIG. 14 is a schematic view showing the arrangement of an imprint system according to one aspect of the present invention.

DESCRIPTION OF THE EMBODIMENTS

Figure 1:
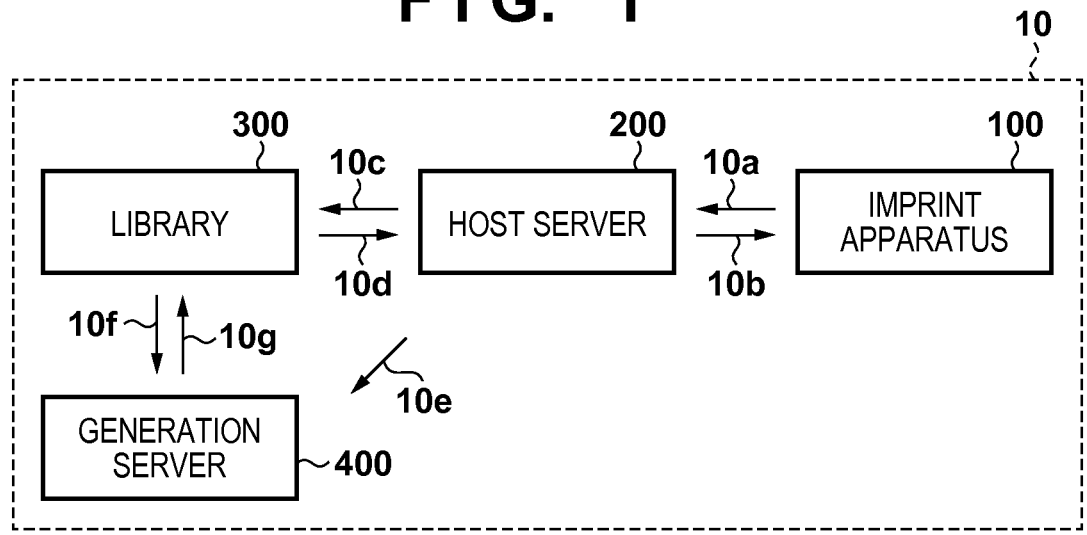
FIG. 1 is a schematic view showing the arrangement of an imprint system according to one aspect of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a schematic view showing the arrangement of an imprint system 10 according to one aspect of the present invention. The imprint system 10 performs an imprint process of molding an imprint material on a substrate by a mold. This embodiment uses a resin as the imprint material and employs, as a resin curing method, a photo-curing method of curing a resin by irradiation with ultraviolet light. However, the present invention does not limit the resin curing method, and may adopt a thermosetting method of curing a resin by heat. The imprint system 10 includes an imprint apparatus (processing unit) 100, a host server (control unit) 200, a library 300, and a generation server (generation unit) 400.

The imprint apparatus 100 includes a dispenser (coating unit) for supplying a resin onto a substrate, and functions as a processing unit that performs the imprint process. For example, the imprint apparatus 100 forms the array of droplets of a resin on a substrate in accordance with a map (also called a resin coating pattern, imprint recipe, or drop recipe) indicating supply positions on a substrate for droplets of a resin to be supplied from the dispenser. The imprint apparatus 100 cures the resin supplied on the substrate in a state in which the mold and resin contact each other, and separates (releases) the mold from the cured resin, thereby forming the pattern on the substrate. The imprint apparatus 100 has a function 10a of transmitting, to the host server 200, information about the result of the imprint process and the state of the imprint apparatus 100.

The host server 200 is constituted by a computer including a CPU, memory, and HDD, and controls the respective units of the imprint system 10, that is, the imprint apparatus 100, the library 300, and the generation server 400. The host server 200 controls, for example, a map indicating supply positions on a substrate for droplets of a resin to be supplied from the dispenser. The host server 200 controls even imprint conditions when performing the imprint process. The host server 200 has a function 10b of transmitting, to the imprint apparatus 100, a map to be used in the imprint process, that is, appropriate for the imprint process, and a function 10c of referring to (inquiring) a map managed in the library 300. The host server 200 also has a function 10e of transmitting, to the generation server 400, information necessary to generate a map or a job indicating an instruction to generate a new map. The information necessary to generate a map includes, for example, the dimension of the pattern of a mold, the residual layer thickness of a pattern to be formed on a substrate, substrate in-plane information, and layout information of shot regions on the substrate. The substrate in-plane information includes the distribution of the evaporation volume of a resin within the plane of the substrate, and the distribution of the airflow within the plane of the substrate.

The library 300 is constituted by a computer including a CPU, memory, and HDD, and manages (stores) a map indicating supply positions on a substrate for droplets of a resin to be supplied from the dispenser. The library 300 has a function 10d of transmitting a map appropriate for the imprint process to the host server 200, and a function 10f of transmitting, to the generation server 400, information necessary to generate a map. The library 300 may have a function of analyzing the generation history and selection history of a plurality of stored maps.

The generation server 400 is constituted by a computer including a CPU, memory, and HDD, and generates, in accordance with a job from the host server 200, a map indicating supply positions on a substrate for droplets of a resin to be supplied from the dispenser. At this time, the generation server 400 generates a map based on the dimension of the pattern of the mold (design value or actually measured value of the pattern of the mold), and the residual layer thickness of a pattern to be formed on a substrate. Further, the generation server 400 may generate a map based on at least one of substrate in-plane information including the distribution of the evaporation volume of a resin within the plane of the substrate and the distribution of the airflow within the plane of the substrate, and layout information of shot regions on the substrate. As described above, the generation server 400 acquires, from the host server 200 or the library 300, information necessary to generate such a map. The generation server 400 has a function 10g of transmitting a generated map to the library 300.

Note that the functions between the apparatus, server, and library constituting the imprint system 10 are not limited to the arrangement shown in FIG. 1. These functions may be implemented between an apparatus, server, and library different from those in the arrangement shown in FIG. 1. The host server 200, the library 300, and the generation server 400 can also be provided outside the imprint system 10. Even in this case, it is necessary to connect the host server 200, the library 300, the generation server 400, and the imprint apparatus 100 so that a map appropriate for the imprint process can be provided to the imprint apparatus 100.

In the imprint system 10, a plurality of different maps are stored in advance in the library 300 in accordance with patterns to be formed on a substrate, and residual layer thicknesses. In the imprint apparatus 100, a map indicating supply positions on a substrate for droplets of a resin to be supplied from the dispenser sometimes needs to be changed in accordance with especially a temporal change of the dispenser or a temporal change of the pattern of the mold. In this case, according to this embodiment, a map appropriate for the imprint process can be set in the imprint apparatus 100, that is, the dispenser by referring to a plurality of maps managed in the library 300 without generating a new map. Since it becomes unnecessary to stop the imprint process and change the mold when changing the map, the productivity (availability) of the imprint apparatus 100 can be increased. In this embodiment, a change of the result of the imprint process caused by a temporal change of at least one of the mold and the dispenser is predicted, and a plurality of corresponding maps is managed in advance. Thus, this embodiment is effective for predictable constant temporal changes and their change widths. In this embodiment, when there is no optimal map among maps managed in advance for a locally generated abnormality, a new map is generated in accordance with the result of the imprint process.

Predictable temporal changes assumed in this embodiment are, for example, a temporal change of the mold and a temporal change of the dispenser, as described above. The temporal change of the mold includes a change of the shape (concave/convex shape) of a pattern caused by cleaning of the mold or the like, that is, changes of the pattern dimension (line width), the volume ratio (duty cycle) of concave and convex portions, the depth of the concave portion (height of the convex portion), the concave/convex taper angle, and the surface roughness (Ra). The temporal change of the dispenser includes changes of the droplet amount and landing position of a resin discharged from the dispenser. Owing to these temporal changes, the result of the imprint process, more specifically, the line width (CD: Critical Dimension) of a pattern formed on a substrate, the residual layer thickness, and the number of defects change.

In this embodiment, one map to be used in the imprint process is selected from a plurality of maps managed in the library 300 based on information about a change of the result of the imprint process. The information about a change of the result of the imprint process includes at least one of the usage history of the mold, the usage history of the dispenser, and the result of the imprint process. The result of the imprint process includes at least one of the line width of a pattern formed on a substrate, the residual layer thickness, and the number of defects.

In this embodiment, one map to be used in the imprint process may be selected from a plurality of maps managed in the library 300 based on even imprint conditions when performing the imprint process, in addition to the information about a change of the result of the imprint process. The imprint conditions include substrate in-plane distribution information including the distribution of the evaporation volume of a resin within the plane of the substrate and the distribution of the airflow within the plane of the substrate, and layout information of shot regions on the substrate.

A plurality of maps managed in the library 300 are generated by predicting a change of the result of the imprint process, as described above. A change of the droplet amount of a resin discharged from the dispenser will be examined. For example, assume that the actually measured value of the droplet amount of the resin discharged from the dispenser used in the imprint apparatus 100 is 5.0 pL. In this case, the range of the change of the droplet amount is predicted to be ±0.5 pL. For every 0.1 pL in the range of 5.0±0.5 pL, corresponding maps, that is, 11 maps are generated and managed in the library 300.

A change of the number of defects of a pattern formed on a substrate will be examined. For example, for every 0.1% in the range of 1%, which is a predicted increase of the supply amount of the resin required upon a change, that is, increase of the number of defects of the pattern, corresponding maps, that is, 11 maps are generated and managed in the library 300.

A change of the residual layer thickness of a pattern to be formed on a substrate will be examined. For example, assume that the design value of the residual layer thickness is 25.0 nm. In this case, the range of a change of the residual layer thickness is predicted to be ±0.5 nm. For every 0.1 nm in the range of 25.0±0.5 nm, corresponding maps, that is, 11 maps are generated and managed in the library 300.

A change of the CD of a pattern formed on a substrate will be examined. For example, assume that the design value of the CD is 50.0 nm. In this case, the range of a change of the CD is predicted to be ±0.5 nm. For every 0.1 nm in the range of 50.0±0.5 nm, corresponding maps, that is, 11 maps are generated and managed in the library 300.

A change of the shape of the pattern of the mold will be examined. For example, for every 0.1% in the range of 1%, which is a predicted increase of the supply amount of the resin required upon a change of the pattern of the mold, corresponding maps, that is, 11 maps are generated and managed in the library 300.

In addition to generating and managing maps in correspondence with respective changes as described above, it is also possible to predict changes for combinations of them (especially, a combination of changes assumed to co-occur), and generate and manage corresponding maps.

When a change of the result of the imprint process is detected in the imprint apparatus 100 or an inspection apparatus, a corresponding map is selected from a plurality of maps managed in the library 300, and is set in the dispenser. If it is necessary to confirm whether the change of the result of the imprint process has been improved (corrected), whether the change has been properly improved can be confirmed using the imprint apparatus 100 or the inspection apparatus.

Even when a change of the result of the imprint process is not detected, the result of the imprint process may be periodically inspected. If a change of the result is detected, a corresponding map may be selected from a plurality of maps managed in the library 300, and be set in the dispenser.

Figure 2:
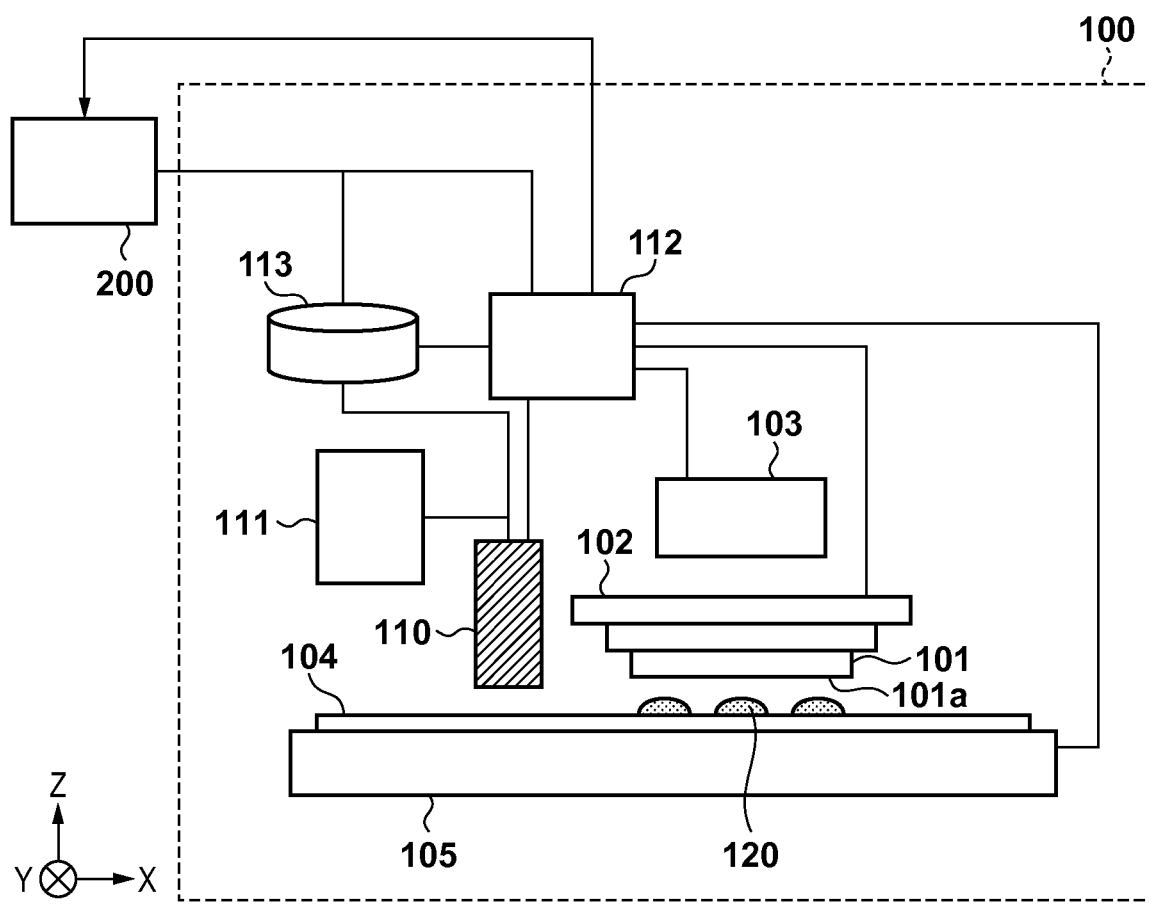
FIG. 2 is a schematic view showing the arrangement of an imprint apparatus.

FIG. 2 is a schematic view showing the arrangement of the imprint apparatus 100 in the imprint system 10. The imprint apparatus 100 is a lithography apparatus used in the manufacturing process of a semiconductor device or the like, and transfers the pattern of a mold to a resin on a substrate, as described above.

The imprint apparatus 100 includes a head 102 that holds a mold 101, an irradiation unit 103, a stage 105 that holds a substrate 104, a dispenser 110, a resin supply unit 111, a control unit 112, and a storage unit 113.

The mold 101 includes, on a surface facing the substrate 104, a pattern region 101a where a pattern to be transferred to a resin 120 supplied to the substrate 104 is formed. The mold 101 has, for example, a rectangular outer shape. The mold 101 is made of a material, such as quartz, that transmits ultraviolet light for curing the resin 120 on the substrate.

The head 102 holds (fixes) the mold 101 by a vacuum chuck force or an electrostatic force. The head 102 includes a driving mechanism that drives (moves) the mold 101 in the z-axis direction. The head 102 has a function of pressing the mold 101 against the uncured resin 120 supplied on the substrate, and a function of separating the mold 101 from the cured resin 120 on the substrate.

The irradiation unit 103 has a function of curing the resin 120 on the substrate. The irradiation unit 103 includes, for example, a halogen lamp or an LED, and irradiates the resin 120 on the substrate with ultraviolet light via the mold 101.

The substrate 104 is a substrate onto which the pattern of the mold 101 is transferred, and includes, for example, a single-crystal silicon substrate and an SOI (Silicon On Insulator) substrate.

The stage 105 includes a substrate chuck that holds the substrate 104, and a driving mechanism for performing alignment between the mold 101 and the substrate 104. The driving mechanism is constituted by, for example, a coarse driving system and a fine driving system, and drives (moves) the substrate 104 in the x- and y-axis directions. The driving mechanism may have a function of driving the substrate 104 in the z-axis direction and the θ (rotation around the z-axis)

direction in addition to the x- and y-axis directions, and a tilt function of correcting the tilt of the substrate 104.

The resin supply unit 111 includes a tank that stores the uncured resin 120. The resin supply unit 111 supplies the uncured resin 120 to the dispenser 110 via a supply pipe.

The dispenser 110 includes, for example, a plurality of nozzles that discharge droplets of the resin 120 to the substrate 104, and supplies the resin 120 onto the substrate (coats the substrate with the resin 120). The unit of the supply amount of the resin 120 in the dispenser 110 is "droplet", and the amount of one droplet of the resin 120 is sub-picoliters or several picoliters. Positions on the substrate to which the dispenser 110 can drop droplets of the resin 120 are determined in every several μm.

While the resin supply unit 111 supplies the resin 120 to the dispenser 110, the stage 105 is driven (scan-driven or step-driven), and the dispenser 110 discharges droplets of the resin 120, thereby forming the array of the droplets of the resin 120 on the substrate.

The control unit 112 includes a CPU and memory, and controls the overall (operation of) imprint apparatus 100. The control unit 112 controls each unit of the imprint apparatus 100 to perform the imprint process. If necessary, the control unit 112 transmits, to the host server 200, the result of the imprint process, the usage histories of the mold 101 and dispenser 110, information about evaporation of the resin 120 such as changes of the temperature and humidity, and the like. The control unit 112 stores, in the storage unit 113, a map acquired from the host server 200.

Figure 3:
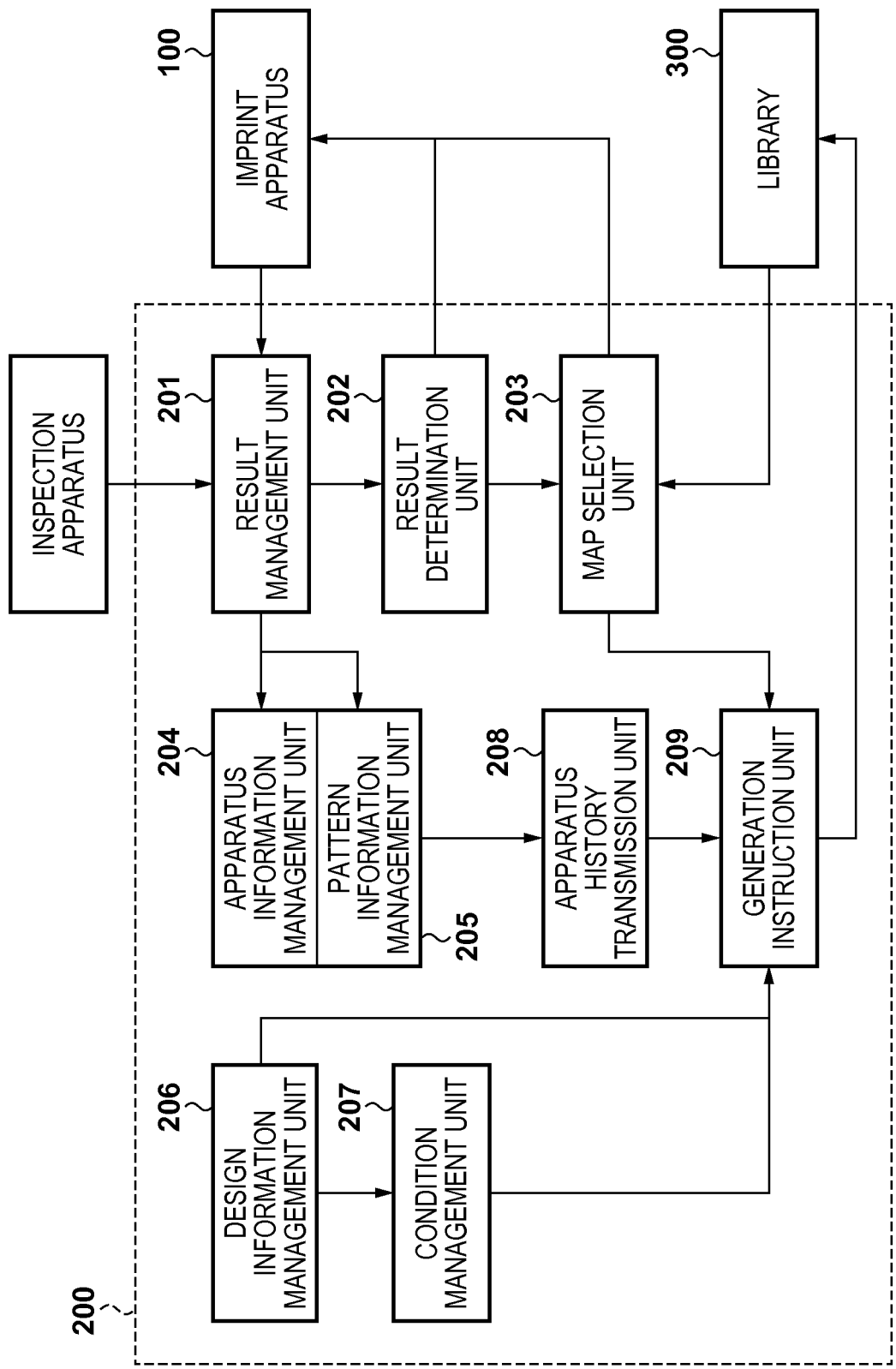
FIG. 3 is a schematic view showing the arrangement of a host server.

FIG. 3 is a schematic view showing the arrangement of the host server 200 in the imprint system 10. The host server 200 includes a result management unit 201, a result determination unit 202, a map selection unit 203, an apparatus information management unit 204, a pattern information management unit 205, a design information management unit 206, a condition management unit 207, an apparatus history transmission unit 208, and a generation instruction unit 209.

The result management unit 201 acquires, from the imprint apparatus 100, pieces of imprint result information including apparatus conditions at the time of the imprint process, the usage history of the mold, the usage history of the dispenser, and the result of the imprint process, and manages them. The result management unit 201 acquires, from the inspection apparatus, even an analysis result of analyzing the result of the imprint process by the imprint apparatus 100 and managing it.

Based on the imprint result information managed by the result management unit 201, the result determination unit 202 determines whether a map indicating supply positions on a substrate for droplets of a resin to be supplied from the dispenser needs to be changed.

When the result determination unit 202 determines that the map needs to be changed, the map selection unit 203 selects an optimal map from a plurality of maps managed in the library 300, and transmits the map to the imprint apparatus 100. When no optimal map is managed in the library 300, the map selection unit 203 selects a map closest to the optimal map, and transmits the map to the imprint apparatus 100. At this time, the map selection unit 203 transmits, to the generation instruction unit 209, a job indicating an instruction to generate a new map (for example, an optimal map).

The apparatus information management unit 204 acquires imprint result information from the result management unit 201, extracts apparatus information from the imprint process information, and manages it. Similarly, the pattern information management unit 205 acquires imprint result information from the result management unit 201, extracts pattern information from the imprint process information, and manages it. The apparatus information management unit 204 and the pattern information management unit 205 monitor a change of managed information, and manage the change as temporal change information.

The design information management unit 206 manages design information (design value) of the pattern of the mold, and inspection instruction (actually measured value) of the pattern of the mold. The condition management unit 207 manages the residual layer thickness of a pattern to be formed on a substrate, layout information of shot regions on the substrate, the filling time of a resin in the pattern of the mold, apparatus settings, and the like.

The apparatus history transmission unit 208 acquires pieces of temporal change information from the apparatus information management unit 204 and the pattern information management unit 205, and transmits them to the generation instruction unit 209.

The generation instruction unit 209 acquires pieces of information necessary to generate a map, from the design information management unit 206, the condition management unit 207, and the apparatus history transmission unit 208 in accordance with a job from the map selection unit 203, and transmits these pieces of information to the generation server 400 together with a job indicating an instruction to generate a map.

By referring to map information managed in a map information management unit 301 and a selection history managed by an analysis unit 303, the generation instruction unit 209 determines whether maps managed in the library 300 are insufficient or will become insufficient. If the generation instruction unit 209 determines that maps are insufficient or will become insufficient, it transmits, to the generation server 400, a job indicating an instruction to generate a new map.

Figure 4:
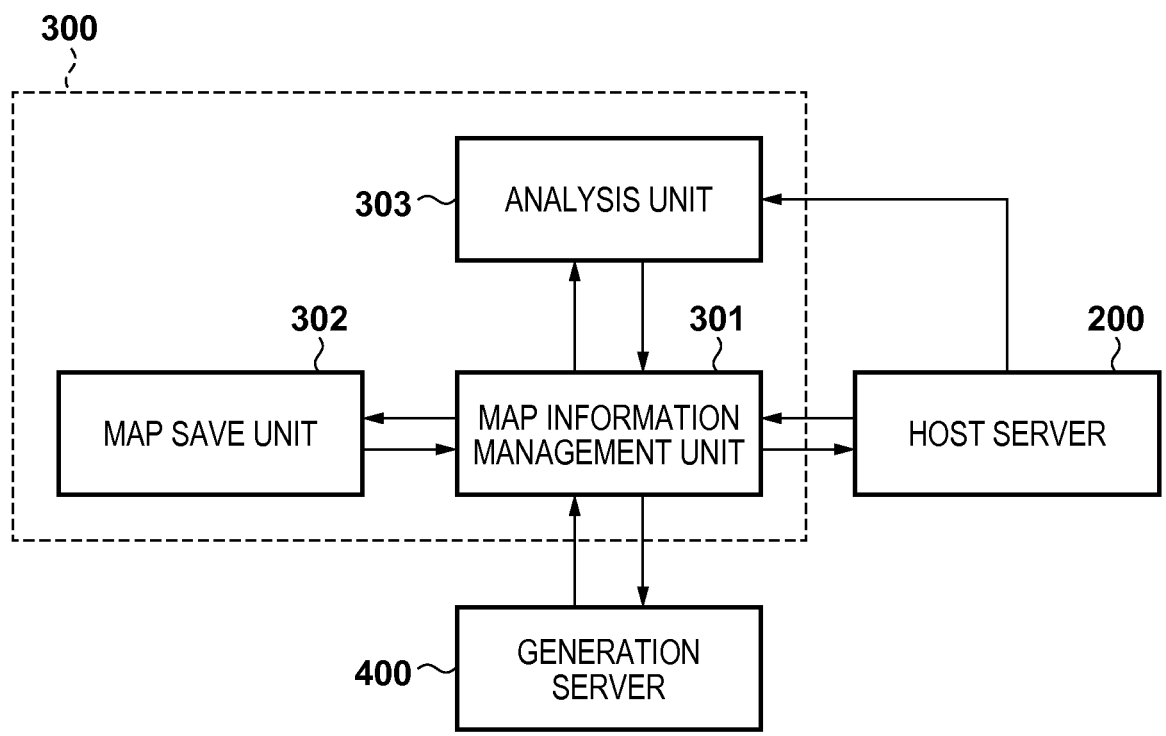
FIG. 4 is a schematic view showing the arrangement of a library.

FIG. 4 is a schematic view showing the arrangement of the library 300 in the imprint system 10. The library 300 includes the map information management unit 301, a map save unit 302, and the analysis unit 303.

The map information management unit 301 manages map information about generation conditions used when a map managed in the library 300 was generated. In response to an inquiry from the host server 200 for a map managed in the library 300, the map information management unit 301 refers to map information and determines whether the target map has been managed. When the target map has been managed, the map information management unit 301 transmits the map to the host server 200. When the map information management unit 301 acquires, from the host server 200, a job indicating an instruction to generate a map, it transmits, to the generation server 400, information necessary to generate a map. Further, the map information management unit 301 acquires, from the generation server 400, map information of a new map generated by the generation server 400, and manages it.

The map save unit 302 saves (stores) a map in a file format transmittable to the imprint apparatus 100. The map save unit 302 transmits a map to the host server 200 via the map information management unit 301, and saves a map generated by the generation server 400.

The analysis unit 303 acquires a map selection result from the host server 200, and manages it as the selection history of the map.

Figure 5:
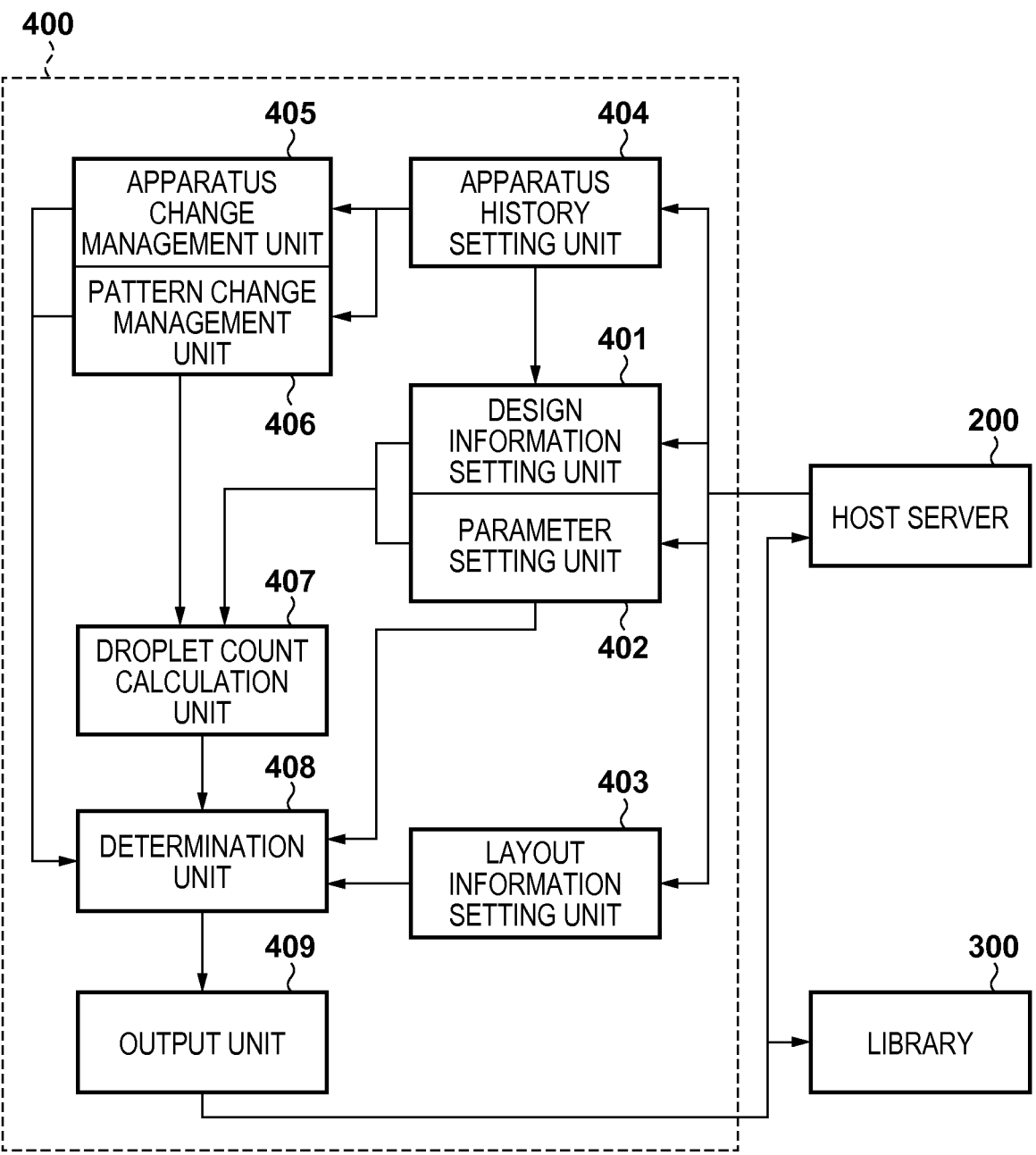
FIG. 5 is a schematic view showing the arrangement of a generation server.

FIG. 5 is a schematic view showing the arrangement of the generation server 400 in the imprint system 10. The generation server 400 includes a design information setting unit 401, a parameter setting unit 402, a layout information setting unit 403, an apparatus history setting unit 404, an apparatus change management unit 405, a pattern change management unit 406, a droplet count calculation unit 407, a determination unit 408, and an output unit 409.

The design information setting unit 401 acquires, from the host server 200, design information of a pattern formed on the mold 101, and sets (inputs) the design information. The parameter setting unit 402 acquires, from the host server 200, setting information including the depth of the concave portion (height of the convex portion) of the mold 101 and the residual layer thickness of a pattern to be formed on the substrate, and sets (inputs) the setting information. The parameter setting unit 402 sets (inputs) constraint conditions such as information about the spread of the resin 120 on the substrate, the filling time of the resin 120 in the pattern of the mold 101, and the interval between droplets of the resin 120 necessary on the substrate.

The layout information setting unit 403 acquires layout information of shot regions on the substrate 104 from the host server 200, and sets (inputs) the layout information. The apparatus history setting unit 404 acquires, from the host server 200, distribution information for determining the droplet correction amount of the resin 120 and the supply positions of droplets on the substrate, which are calculated from the usage histories of the mold 101 and dispenser 110. Then, the apparatus history setting unit 404 sets (inputs) the distribution information.

The apparatus change management unit 405 manages (provides) distribution information for determining the droplet correction amount of the resin 120 and the supply positions of droplets on the substrate, which are calculated from the usage history of the dispenser 110. The pattern change management unit 406 manages (provide) distribution information for determining the droplet correction amount of the resin 120 and the supply positions of droplets on the substrate, which are calculated from the usage history of the mold 101.

The droplet count calculation unit 407 calculates the supply amount of the resin 120 to be supplied to an imprint region on a subject to undergo the imprint process, that is, the droplet count of the resin 120. The droplet count calculation unit 407 calculates a droplet count based on, for example, pieces of information set by the design information setting unit 401 and the parameter setting unit 402, pieces of information managed by the apparatus change management unit 405 and the pattern change management unit 406, the droplet correction amount.

The determination unit 408 determines the array of droplets of the resin 120 on the substrate, that is, the supply positions of droplets of the resin 120. The determination unit 408 determines supply positions based on, for example, pieces of information set by the design information setting unit 401 and the parameter setting unit 402, pieces of information managed by the apparatus change management unit 405 and the pattern change management unit 406, the droplet count calculated by the droplet count calculation unit 407, the droplet correction amount.

The output unit 409 outputs a map in a designated form based on the supply positions of droplets of the resin 120 on the substrate that have been determined by the determination unit 408. The map output from the output unit 409 is transmitted to the library 300 and managed.

Figure 6:
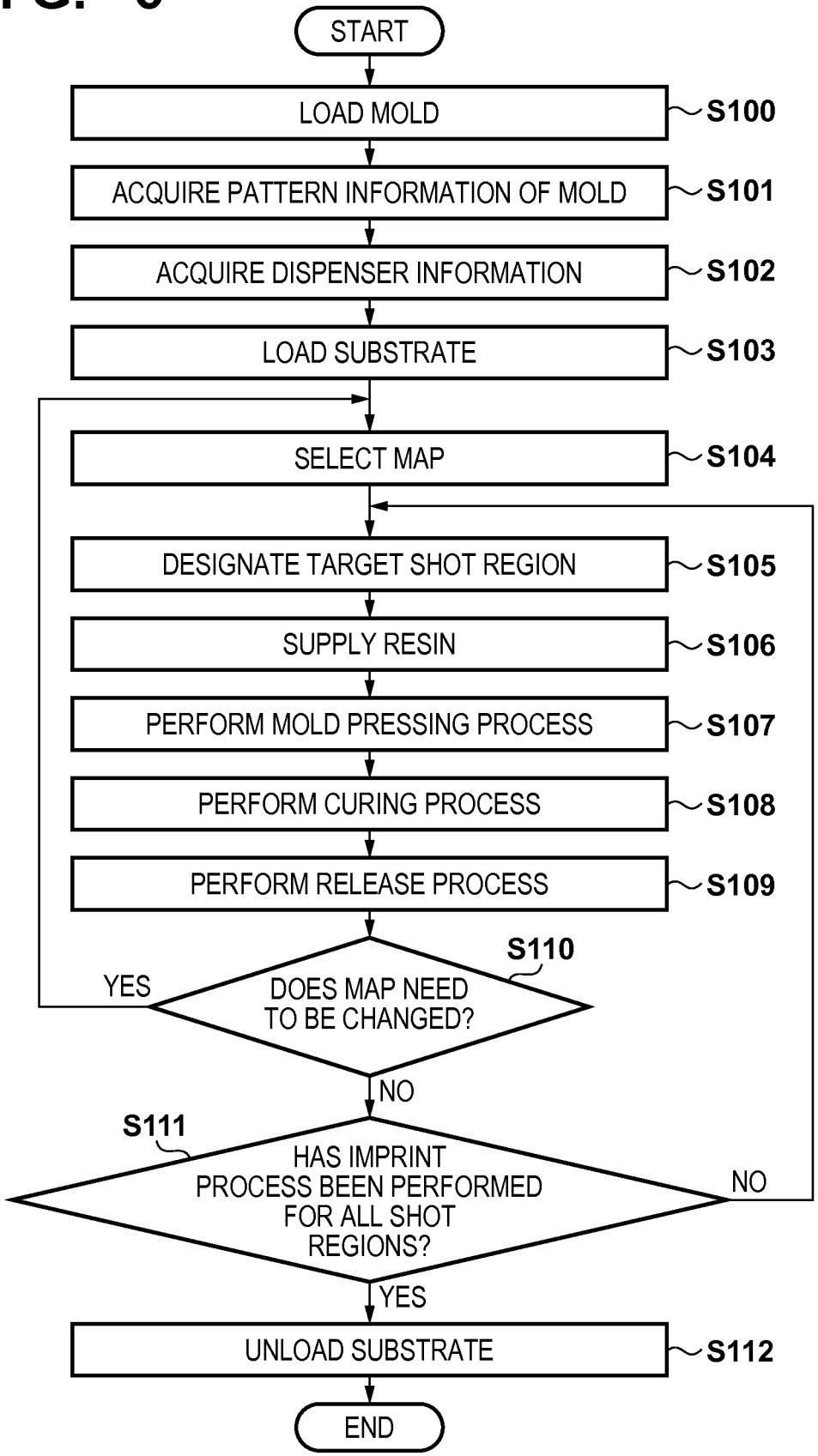
FIG. 6 is a flowchart for explaining an imprint process.

The imprint process in the imprint system 10 will be explained in detail. FIG. 6 is a flowchart for explaining the imprint process in the imprint system 10. As described above, the imprint process is performed by centralized control of the imprint apparatus 100, the library 300, and the generation server 400 by the host server 200, and centralized control of each unit of the imprint apparatus 100 by the control unit 112.

In step S100, the mold 101 capable of forming a pattern that should be formed on the substrate 104 is loaded into the imprint apparatus 100, and the head 102 holds the mold 101. The mold 101 is constituted by, for example, forming a concave/convex pattern corresponding to design information on a transparent quartz substrate used for a photomask. An ID for identifying the pattern is generally set for the mold 101.

In step S101, the ID of the mold 101 held by the head 102 is read. Based on the ID, pattern information of the mold 101, more specifically, the arrangement, line width, and density of the pattern, the measurement result of the shape of the pattern, or the like is acquired from the host server 200.

In step S102, dispenser information about the dispenser 110 mounted in the imprint apparatus 100 is acquired from the host server 200. The dispenser information includes, for example, the type of the dispenser 110, the number of nozzles, the average discharge amount serving as discharge performance, variations of the discharge amount of each nozzle, and variations of the landing position on the substrate. An ID for identifying dispenser information is generally set for the dispenser 110. By reading the ID, dispenser information about the dispenser 110 mounted in the imprint apparatus 100 can be acquired.

Figure 7A:
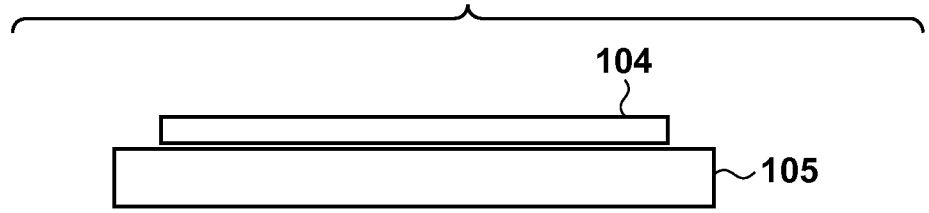
FIGS. 7A to 7C are views for explaining the imprint process.

In step S103, the substrate 104 is loaded into the imprint apparatus 100, and the stage 105 holds the substrate 104, as shown in FIG. 7A.

In step S104, one map to be used in the imprint process is selected from a plurality of maps managed in the library 300. More specifically, a map is selected based on at least one of the pattern information and dispenser information respectively acquired in steps S101 and S102, the usage history of the mold 101, the usage history of the dispenser 110, and the result of the imprint process. As described above, the map indicates supply positions on a substrate for droplets of the resin 120 to be supplied from the dispenser 110. In this embodiment, the map is generated by the generation server 400, and optimized so that the imprint process free from a defect or a residual layer thickness abnormality can be performed for the target filling time.

Figure 7B:
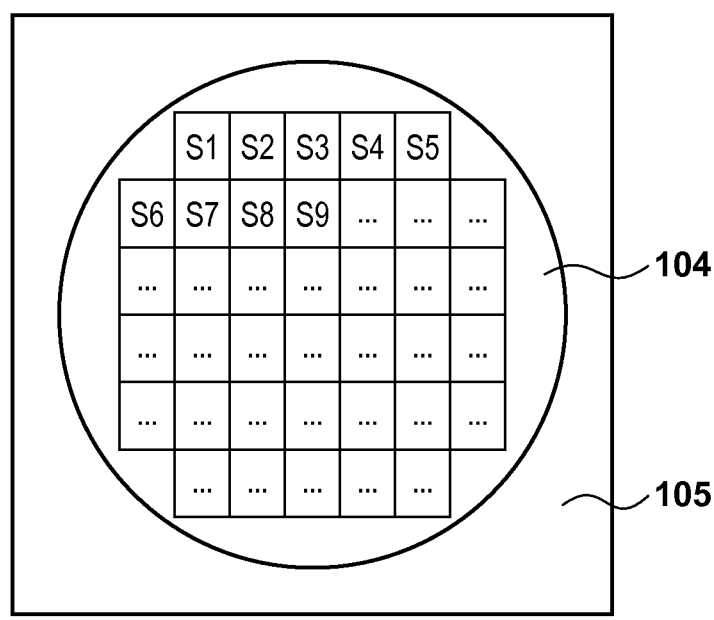

In step S105, a shot region not having undergone the imprint process out of shot regions on the substrate is designated as a target shot region. The shot region is a region where a pattern is formed by one imprint process. The target shot region is a shot region to undergo the imprint process from now. In this embodiment, for example, the imprint process is performed in the order of successive shot regions S1, S2, S3, S4, . . . on the substrate 104, as shown in FIG. 7B. Note that the order of the imprint process is not limited to one as shown in FIG. 7B, and may be a staggered pattern order or random.

Figure 7C:
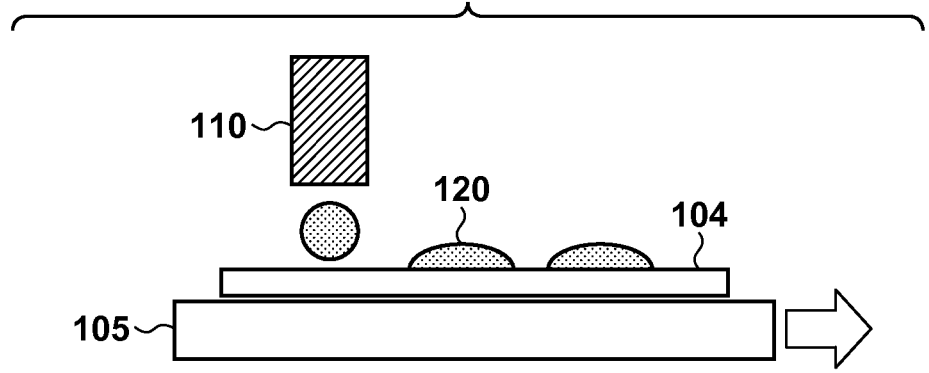

In step S106, the resin 120 is supplied from the dispenser 110 onto the substrate. At this time, as shown in FIG. 7C, the dispenser 110 sequentially discharges droplets of the resin 120 onto the substrate along with movement of the stage 105 in accordance with the map selected in step S104.

Figure 8A:
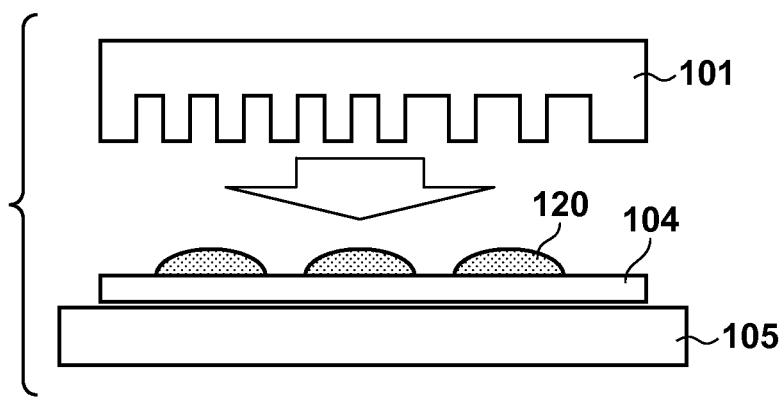
FIGS. 8A to 8D are views for explaining the imprint process.
Figure 8B:
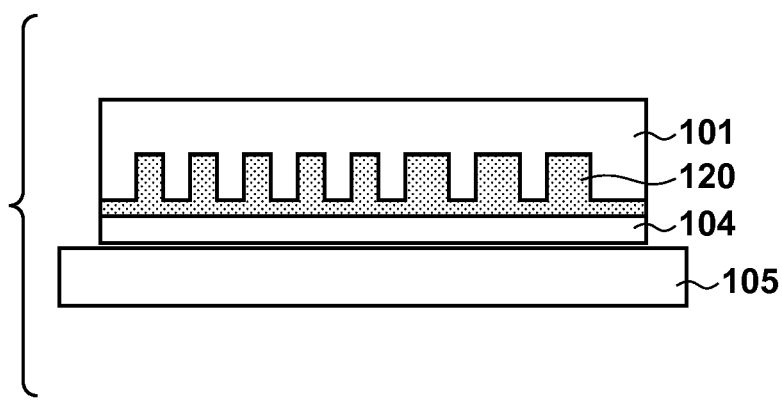

In step S107, a mold pressing process is performed. More specifically, first, as shown in FIG. 8A, the mold 101 is brought close to the substrate 104 to which the resin 120 has been supplied. Then, as shown in FIG. 8B, the mold 101 and the resin 120 on the substrate are brought into contact with each other while the mold 101 and the substrate 104 are aligned. This state is maintained until the pattern of the mold 101 is filled with the resin 120. At an initial stage at which the mold 101 and the resin 120 on the substrate are brought into contact with each other, the filling of the pattern of the mold 101 with the resin 120 is insufficient, and filling defects are generated at the corners of the pattern. However, with the lapse of time, every corner of the pattern of the mold 101 is filled with the resin 120, decreasing the filling defects.

Figure 8C:
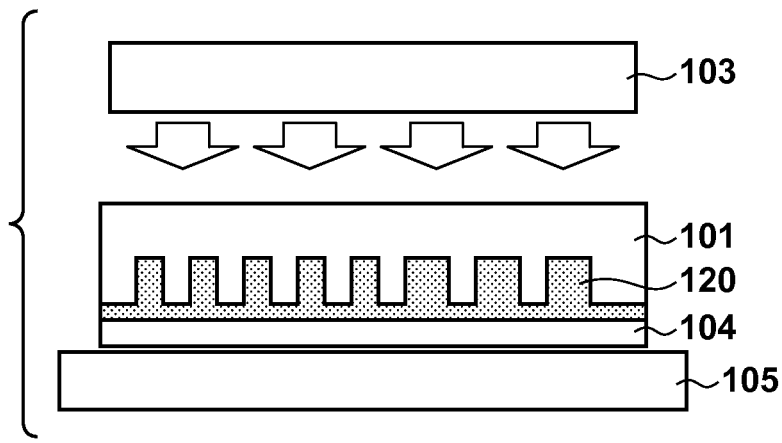

In step S108, a curing process is performed. More specifically, after the pattern of the mold 101 is satisfactorily filled with the resin 120, the irradiation unit 103 irradiates the resin 120 with ultraviolet light from the back surface of the mold 101 for a predetermined time, as shown in FIG. 8C, thereby curing the resin 120 on the substrate.

Figure 8D:
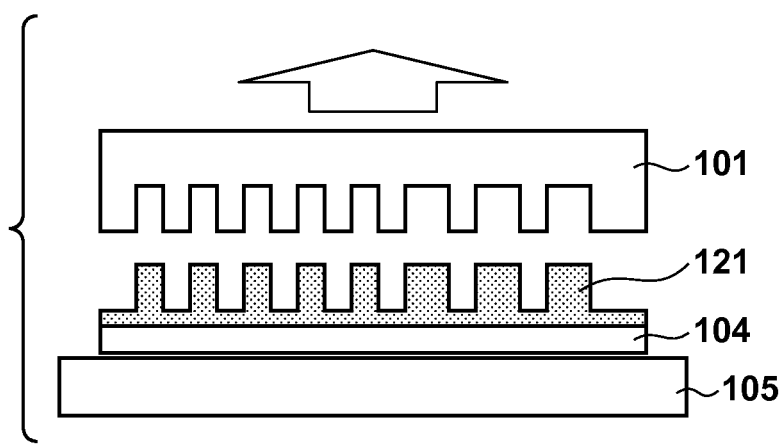

In step S109, a release process is performed. More specifically, as shown in FIG. 8D, the mold 101 is separated from the cured resin 120 on the substrate. As a result, a resin pattern 121 corresponding to the pattern of the mold 101 is formed on the substrate.

In step S110, it is determined whether the map selected in step S104 needs to be changed. The criterion of this determination is, for example, a change of the result of the imprint process, that is, a change of the CD of the pattern formed on the substrate, the residual layer thickness, the number of defects, or the like. Such a change arises from the amount of droplets of the resin 120 discharged from the dispenser 110, a shift of the landing position, a change of the dimension of the pattern of the mold 101, an excess of the usage limit count of the mold 101, or the like. Such a change also arises from variations of the pressing force or release force of the mold 101, dust sandwiched between the mold 101 and the substrate 104 in the mold pressing process, or the like. A change of the result of the imprint process can be detected by the imprint apparatus 100 or an external inspection apparatus. When a change of the result of the imprint process is detected, this may cause a transfer failure (product failure) of the pattern, so the imprint process may be stopped. If the map needs to be changed, the process shifts to step S104 in order to select a new map. If the map need not be changed, the process shifts to step S111.

In step S111, it is determined whether the imprint process has been performed for all the shot regions of the substrate 104. If the imprint process has not been performed for all the shot regions of the substrate 104, the process shifts to step S105 in order to designate, as a target shot region, a shot region not having undergone the imprint process. By repeating the processes in steps S105 to S111, the resin pattern 121 is formed in all the shot regions of the substrate 104. If the imprint process has been performed for all the shot regions of the substrate 104, the process shifts to step S112.

In step S112, the substrate 104 having undergone the imprint process in all the shot regions is unloaded from the imprint apparatus 100. The substrate 104 unloaded from the imprint apparatus 100 is processed (for example, etched) on the lower layer side by using the resin pattern 121 as a mask. When manufacturing a semiconductor device, these processes are repeated for every layer of the process.

A case will be examined, in which the imprint process is performed on the substrate 104 of the next lot by using the same mold 101 and dispenser 110. In this case, the map (same map) used for the previous lot is selected as a map to be used in this imprint process.

In the determination (step S110) of whether the map needs to be changed, it may also be determined whether the mold 101 needs to be cleaned. If the mold 101 need not be cleaned, an optimal map is selected from a plurality of maps managed in the library 300 in accordance with the usage history of the mold 101. At this time, if no optimal map is managed in the library 300, a job indicating an instruction to generate this map is transmitted from the host server 200 to the generation server 400. Then, a map generated by the generation server 400 in accordance with this job is stored in the library 300 and transmitted to the imprint apparatus 100 via the host server 200.

If the mold 101 needs to be cleaned, the imprint process is stopped and the mold 101 is detached from the head 102. In this case, it is preferable to hold a new mold 101 by the head 102, and select a map corresponding to the new mold 101 from a plurality of maps managed in the library 300, thereby minimizing the period in which the imprint process is stopped.

The mold 101 detached from the head 102 is loaded into a mold cleaning apparatus and cleaned. The mold cleaning apparatus may be, for example, a cleaning apparatus that performs wet cleaning using a chemical or pure water for dust or dirt attached to the mold 101, or a cleaning apparatus that performs dry cleaning using an excimer laser, plasma, or the like. After the end of cleaning the mold 101, this cleaning is added to the usage history of the mold 101.

When the mold 101 is cleaned, its pattern may be worn to change the shape of the pattern. Hence, the shape (concave/convex shape) of the pattern of the cleaned mold 101 needs to be measured. More specifically, the pattern dimension of the mold 101, the volume ratio (duty cycle) of concave and convex portions, the depth of the concave portion (height of the convex portion), the concave/convex taper angle, the surface roughness (Ra), and the like are measured as the shape of the pattern of the mold 101. Such physical quantities representing the shape of the pattern of the mold 101 can be measured using a general dimension measurement apparatus, height measurement apparatus, and roughness measurement apparatus.

For example, when measuring the line width and duty cycle of the pattern of the mold 101, an electron beam type dimension measurement apparatus (CD-SEM) is used. When the pattern of the mold 101 is a repetitive pattern of a line (concave portion) and space (convex portion), the width of the line and the width of the space are measured at a plurality of portions. If there is a difference from widths measured before cleaning the mold 101, the line width of the pattern of the mold 101 has changed. The duty cycle can be obtained from the ratio of the line and space.

When measuring the depth of the concave portion, concave/convex taper angle, and surface roughness of the mold 101, an AFM or a confocal microscope is used. They may be obtained by directly measuring the pattern of the mold 101, or indirectly obtained by measuring a measurement pattern provided outside the pattern of the mold 101.

When the mold 101 is cleaned, the surface (pattern region 101a) of the mold 101 is worn by a predetermined amount and thinned. In addition, the distribution of the wear amount is generated in accordance with the pattern. For example, when the pattern of the mold 101 is a repetitive pattern of a line (concave portion) and space (convex portion), the width of the concave portion is increased and the width of the convex portion is decreased by cleaning, so the volume ratio of the concave portion increases. When the convex portion is further worn, the height of the convex portion further decreases and the concave/convex taper angle decreases. When the concave and convex on the surface of the mold 101 become small, the surface roughness decreases.

Physical quantities representing the pattern (concave/convex shape) of the mold 101 can be measured not by directly measuring the pattern of the mold 101, but by measuring a resin pattern obtained by a test imprint process performed after cleaning. When measuring a resin pattern obtained by the test imprint process, the resin pattern may be cut out to measure its section.

The dimension of the pattern of the mold 101 measured in this manner is transmitted to the host server 200 and managed as the actually measured value of the dimension of the pattern of the mold 101. When performing the imprint process using the cleaned mold 101, a new map is selected or generated based on history information of the mold 101 including the fact that the mold 101 has been cleaned, and the new map is used for the imprint process.

Figure 9:
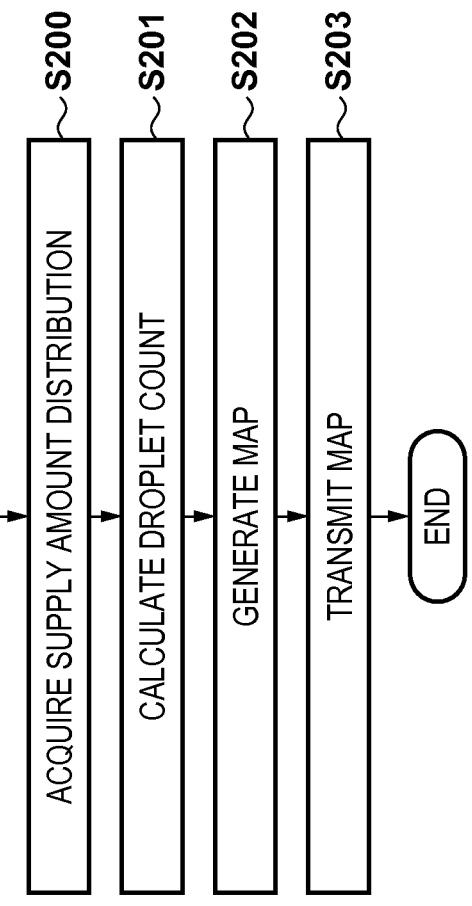
FIG. 9 is a flowchart for explaining a process of generating a map.

A process of generating a map indicating supply positions on a substrate and a supply amount for droplets of the resin 120 to be supplied from the dispenser 110 will be explained in detail with reference to FIG. 9. In this embodiment, a map is generated by the generation server 400 and managed in the library 300, as described above. However, a map may be generated by an information processing apparatus or the like outside the imprint system 10, and managed in the library 300.

In step S200, a supply amount distribution calculated from a supply amount (coating amount) of the resin 120 that is necessary for each region on a substrate is acquired from design information of the pattern of the mold 101 and apparatus information. The supply amount distribution is calculated based on pieces of information from the apparatus information management unit 204, the pattern information management unit 205, the design information management unit 206, the condition management unit 207, and the generation instruction unit 209 in the host server 200. These pieces of information include the dimension of the pattern of the mold 101, the residual layer thickness of a pattern to be formed on a substrate, substrate in-plane distribution information including the distribution of the evaporation volume of a resin and the distribution of the airflow within the plane of the substrate 104, and layout information of shot regions on the substrate 104.

Figure 10:
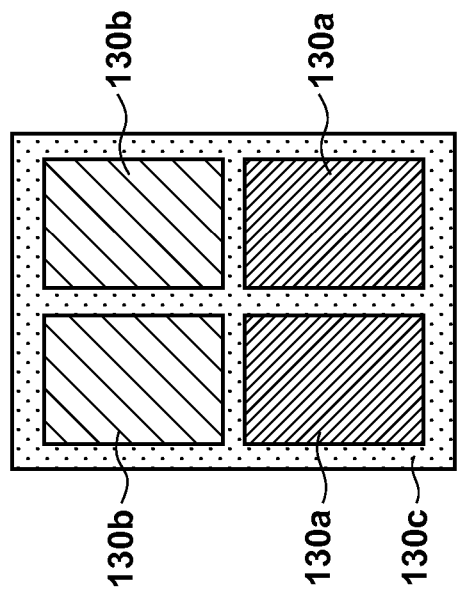
FIG. 10 is a view showing an example of supply amount distribution information.

In this embodiment, image data obtained by converting the supply amount distribution of the resin 120 on the substrate into multi-value information of the tone is used as the supply amount distribution information, as shown in FIG. 10. Referring to FIG. 10, regions 130a to 130c represent tones calculated based on the position, shape, and depth of the pattern of the mold 101 and the like. The region 130a is a region where the depth of the pattern is large and the necessary volume of the resin 120 is large. The region 130b is a region where the depth of the pattern is small and the necessary volume of the resin 120 is smaller than that in the region 130a. The region 130c is a region where there is no pattern and the necessary volume of the resin 120 is smaller than that in the region 130b.

In step S201, the droplet count of the resin 120 necessary in an imprint region on the substrate is calculated based on supply amount distribution information acquired in step S200 and the size (for example, droplet amount) of the droplet of the resin 120 discharged from the dispenser 110.

Figure 11:
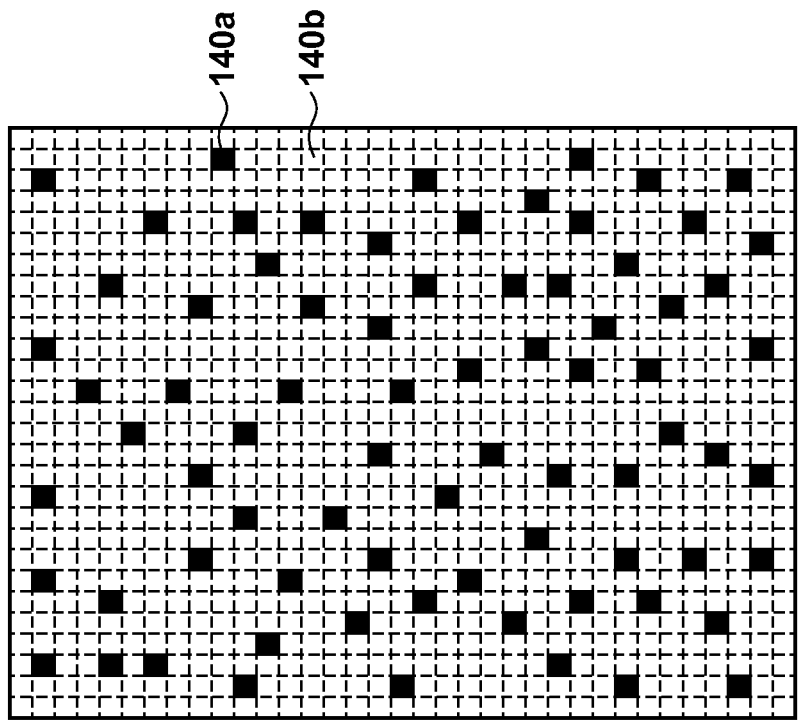
FIG. 11 is a view showing an example of a map.

In step S202, a map indicating supply positions on a substrate and a supply amount for droplets of the resin 120 to be supplied from the dispenser 110 is generated based on the supply amount distribution acquired in step S200 and the droplet count calculated in step S201. More specifically, first, multi-value distribution data is generated from the supply amount distribution information acquired in step S200. Then, the multi-value distribution data is binarized by a halftone process, and converted into information designating discharge/non-discharge of a droplet of the resin 120 from the dispenser 110, thereby generating a map. As the halftone process, an error diffusion method, which is a well-known technique, can be used. FIG. 11 is a view showing an example of the map generated in step S202. In FIG. 11, a filled circle 140a indicates the supply position (discharge of a droplet) of a droplet of the resin 120 on the substrate, and an open circle 140b indicates the non-supply position (non-discharge of a droplet) of a droplet of the resin 120 on the substrate.

In step S203, the map generated in step S202, that is, the map indicating supply positions on a substrate for droplets of the resin 120 to be supplied from the dispenser 110 is transmitted to the library 300. This map is saved in the map save unit 302 in the library 300.

In this embodiment, the error diffusion method is used as the halftone process in the process of generating a map. However, the halftone process is not limited to this, and another method such as a dither method is also applicable. A method other than the halftone process is also applicable as long as droplets of a necessary amount can be arranged in a necessary region on a substrate.

In this embodiment, data converted into binary information designating discharge/non-discharge of droplets of the resin 120 is used as the map. However, the data format is not particularly limited. For example, numerical data indicating the supply positions of droplets of the resin 120 on the substrate by relative position coordinates on the substrate can also be used as the map. Information about the amount (droplet amount) of each droplet of the resin 120 on the substrate can also be added to the map.

The imprint system 10 according to this embodiment predicts a change of the result of the imprint process caused by a temporal change of at least one of the mold 101 and dispenser 110, and manages a plurality of corresponding maps in advance. Therefore, a map appropriate for the imprint process can be selected from the plurality of maps managed in the library 300 without generating a new map in accordance with a change of the result of the imprint process. Since it becomes unnecessary to stop the imprint process and change the mold 101 when changing the map, the productivity (availability) of the imprint apparatus 100 can be increased.

Second Embodiment

Figure 12:
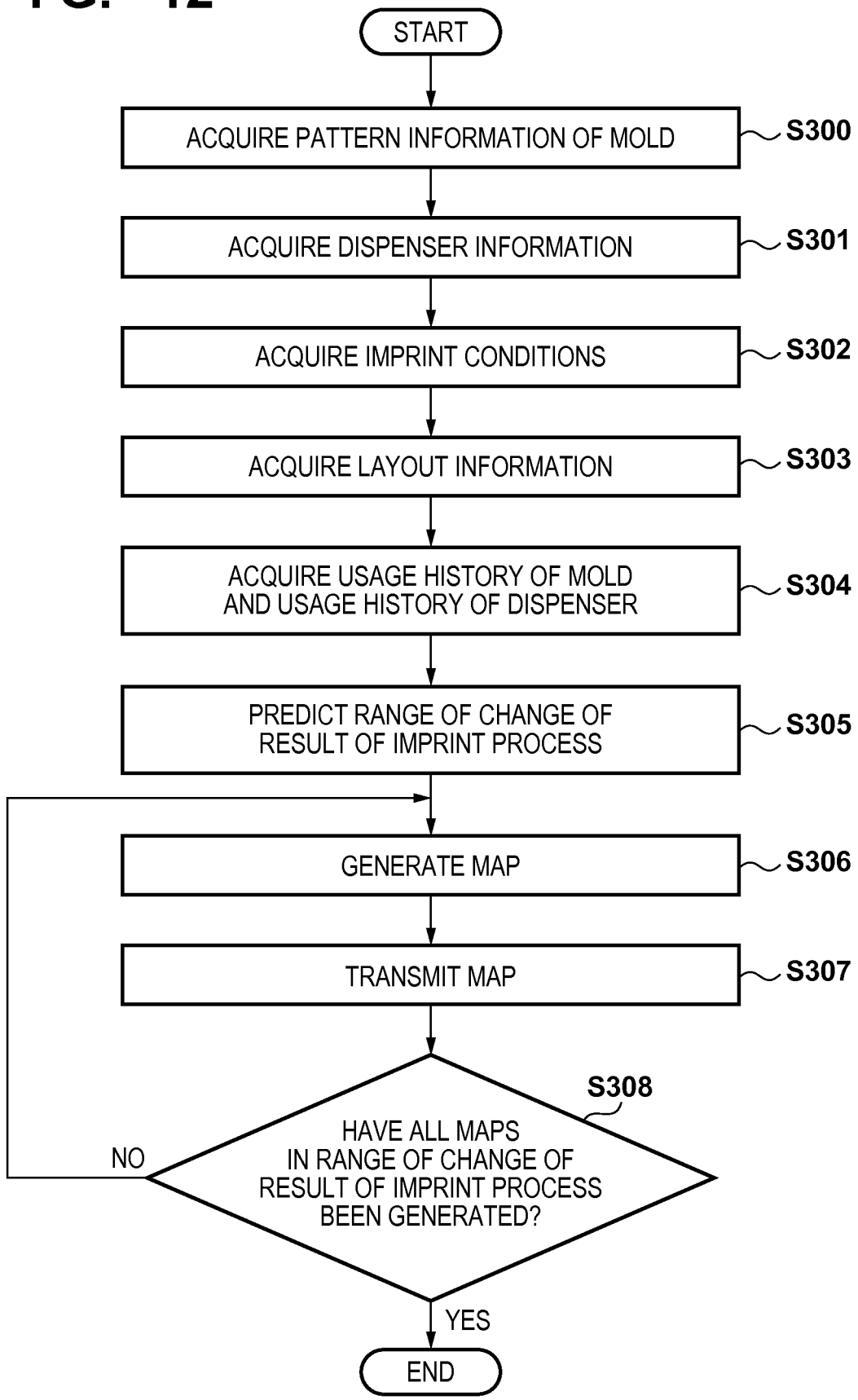
FIG. 12 is a flowchart for explaining a process of generating a map.

A process of generating a plurality of maps in the range of the result of the imprint process, a change of which is predicted from a temporal change of a mold 101, a dispenser 110, or the like, will be described with reference to FIG. 12. In this embodiment, as described above, a map is generated by a generation server 400 and managed in a library 300. However, a map may be generated by an information processing apparatus or the like outside an imprint system 10, and managed in the library 300.

In step S300, pattern information of the mold 101, more specifically, the arrangement, line width, and density of the pattern, the measurement result of the shape of the pattern, or the like is acquired from a host server 200. In step S301, dispenser information about the dispenser 110 mounted in an imprint apparatus 100 is acquired from the host server 200.

In step S302, imprint conditions when performing the imprint process are acquired from the host server 200. In step S303, layout information of shot regions on a substrate 104 is acquired from the host server 200. In step S304, the usage history of the mold 101 and the usage history of the dispenser 110 are acquired from the host server 200.

In step S305, the range of a change of the result of the imprint process is predicted based on the pattern information, the dispenser information, the imprint conditions, the usage history of the mold 101, and the usage history of the dispenser 110 that have been acquired in steps S300 to S303. At this time, a plurality of results for which maps should be generated is set in the range of a change of the result of the imprint process. In this embodiment, the range of the change centered on the current result of the imprint process (that is, the current state of the imprint apparatus 100) is predicted.

In step S306, a map in the range of a change of the result of the imprint process that has been predicted in step S305 is generated. In this embodiment, a map corresponding to one of a plurality of results set in the range of a change of the imprint process is generated. Note that the generation of the map is the same as that in the first embodiment, and a detailed description thereof will not be repeated.

In step S307, the map generated in step S306, that is, the map indicating supply positions on a substrate for droplets of a resin 120 to be supplied from the dispenser 110 is transmitted to the library 300. The map is saved in a map save unit 302 in the library 300.

In step S308, it is determined whether all maps in the range of the result of the imprint process predicted in step S305, that is, maps corresponding to respective results set in the range of a change of the imprint process have been generated. If not all maps have been generated, the process shifts to step S306 in order to generate a new map in the range of the result of the imprint process. If all maps have been generated, the process ends.

Figure 13:
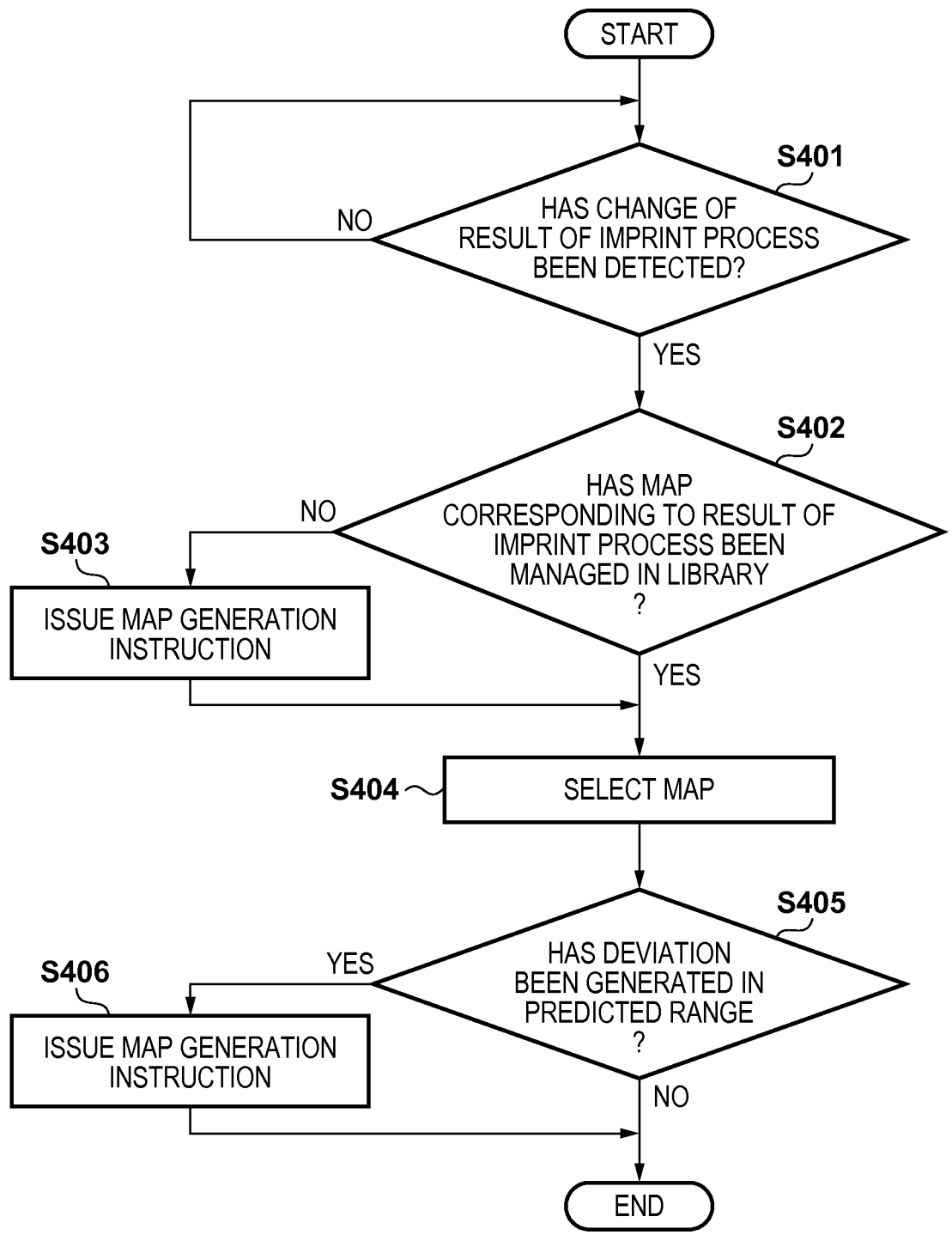
FIG. 13 is a flowchart for explaining a process regarding changing and updating of a map.

In the imprint system 10, the map indicating supply positions on a substrate for droplets of the resin 120 to be supplied from the dispenser 110 can be changed in accordance with a change of the result of the imprint process, and in addition, maps managed in the library 300 can also be updated. A process regarding changing and updating of the map upon a change of the result of the imprint process will be explained with reference to FIG. 13. This process is performed by centralized control of the imprint apparatus 100, the library 300, and the generation server 400 by the host server 200.

In step S401, it is determined whether a change of the result of the imprint process has been detected. As described above, a change of the result of the imprint process can be detected by the imprint apparatus 100 or an external inspection apparatus. If a change of the result of the imprint process has not been detected, the process waits until a change of the result of the imprint process is detected. If a change of the result of the imprint process has been detected, the process shifts to step S402.

In step S402, it is determined whether an optimal map corresponding to the result of the imprint process (that is, a map to be used in the next imprint process) has been managed in the library 300 in accordance with the change of the result of the imprint process that has been detected in step S401. If a map corresponding to the result of the imprint process has not been managed in the library 300, the process shifts to step S403. If a map corresponding to the result of the imprint process has been managed in the library 300, the process shifts to step S404.

In step S403, the generation server 400 is instructed to generate a map corresponding to the result of the imprint process. A map generated by the generation server 400 is transmitted to the library 300 and managed.

In step S404, an optimal map corresponding to the result of the imprint process is selected as a map to be used in the next imprint process from a plurality of maps managed in the library 300.

In step S405, it is determined from the map selection result in step S404 whether a deviation has been generated in the range (predicted range) of a predicted change of the result of the imprint process, that is, the range of a change of the result of the imprint process varies (for example, from the first range to the second range). If a deviation has been generated in the predicted range, the process shifts to step S406. If no deviation has been generated in the predicted range, the process ends.

In step S406, the range (for example, second range) of the result of the imprint process is newly predicted in accordance with the deviation of the predicted range, and the generation server 400 is instructed to generate a plurality of maps in this range. In this embodiment, the generation server 400 is instructed to generate maps corresponding to respective results in a new predicted range centered on the result of the imprint process corresponding to the map selected in step S404. The plurality of maps generated by the generation server 400 are transmitted to the library 300 and managed. At this time, it is preferable that generation of a plurality of maps in the new predicted range by the generation server 400 is performed parallel to the imprint process by the imprint apparatus 100. Since it becomes unnecessary to generate a new map, that is, stop the imprint process when a change of the result of the imprint process is newly detected, the productivity (availability) of the imprint apparatus 100 can be increased. A preceding predicted range (first range) and a new predicted range (second range) may partially overlap each other.

As described above, according to the this embodiment, when a deviation is generated in the range (predicted range) of a predicted change of the result of the imprint process, maps corresponding to respective results in a new predicted range are generated and managed in the library 300. In other words, maps managed in the library 300 are updated in accordance with a change of the result of the imprint process. Hence, no new map need be generated in accordance with a change of the result of the imprint process, and a map appropriate for the imprint process can be selected from a plurality of maps managed in the library 300. Since it becomes unnecessary to stop the imprint process and change the mold 101 when changing the map, the productivity (availability) of the imprint apparatus 100 can be increased.

Third Embodiment

FIG. 14 is a schematic view showing the arrangement of an imprint system 11 according to one aspect of the present invention. The imprint system 11 includes the same arrangement as that of the imprint system 10, and performs the imprint process of molding an imprint material on a substrate by a mold. More specifically, the imprint system 11 includes other imprint apparatuses 100A and 100B, in addition to an imprint apparatus 100, a host server 200, a library 300, and a generation server 400. The host server 200 controls the imprint apparatuses 100, 100A, and 100B.

A case in which the imprint apparatuses 100, 100A, and 100B simultaneously perform the imprint process will be examined. In this case, the host server 200 selects one map to be used in the imprint process from a plurality of maps managed in the library 300 for each of the imprint apparatuses 100, 100A, and 100B. This is because molds 101 and dispensers 110 used in the imprint apparatuses 100, 100A, and 100B are different (separate) between the apparatuses. When the molds 101 and dispensers 110 used in the imprint apparatuses 100, 100A, and 100B do not have a substantial difference, the same map may be selected for the imprint apparatuses 100, 100A, and 100B. However, when a change of the result of the imprint process becomes different between the imprint apparatuses 100, 100A, and 100B, an optimal map needs to be selected for each of the imprint apparatuses 100, 100A, and 100B.

In this embodiment, when managing a map, the library 300 identifies and manages each of the imprint apparatuses 100, 100A, and 100B. In other words, the library 300 manages a map in a predicted range for each of the imprint apparatuses 100, 100A, and 100B. This can increase the possibility at which an optimal map can be selected even when a change of the result of the imprint process becomes different between the imprint apparatuses 100, 100A, and 100B.

A predicted range for each of the imprint apparatuses 100, 100A, and 100B can also be set by referring to a map selection result in another imprint apparatus. A case will be examined, in which the cleaning count of the mold 101 used in the imprint apparatus 100 is higher than that of the mold 101 used in the imprint apparatus 100A. In this case, a map to be selected in the imprint apparatus 100A can be predicted from the selection history of the map in the imprint apparatus 100. For example, in some cases, there is a difference between a change of the dimension of the pattern of the mold 101 that is predicted in advance for cleaning of the mold 101, and a change of the dimension of the pattern of the mold 101 actually used in the imprint apparatus 100. This difference is reflected in the predicted range in the imprint apparatus 100A. This can increase the possibility at which an optimal map can be selected when the cleaning count of the mold 101 used in the imprint apparatus 100A reaches that of the mold 101 used in the imprint apparatus 100.

In the imprint system 11 including a plurality of imprint apparatuses, the accuracy of the predicted range can be increased by reflecting a map selection result in each imprint apparatus in the predicted range of another imprint apparatus.

In this embodiment, one host server 200 controls the three imprint apparatuses 100, 100A, and 100B. When one host server controls a plurality of imprint apparatuses, the load of the host server is assumed to be large. Each imprint apparatus may have a function of selecting a map indicating supply positions on a substrate for droplets of a resin to be supplied from the dispenser. In this case, the host server manages the selection history of the map in each imprint apparatus.

In this manner, even when the imprint system 11 includes a plurality of imprint apparatuses, each imprint apparatus is identified and a plurality of maps are managed in advance. Accordingly, a map appropriate for the imprint process can be selected from a plurality of maps managed in the library 300 without generating a new map in accordance with a change of the result of the imprint process. Since it becomes unnecessary to stop the imprint process and change the mold 101 when changing the map, the productivity (availability) of the imprint apparatus 100 can be increased.

Fourth Embodiment

A method of manufacturing a device (a semiconductor device, magnetic storage medium, liquid crystal display element, or the like) as an article will be described. This manufacturing method includes a step of forming a pattern on a substrate (a wafer, glass plate, film-like substrate, or the like) using an imprint system 10 or 11. The manufacturing method also includes a step of processing the substrate on which the pattern has been formed. This processing step can include a step of removing the residual film of the pattern. In addition, the method can include other known steps such as a step of etching the substrate using the pattern as a mask. The method of manufacturing an article according to this embodiment is advantageous over the related art in terms of at least one of the performance, quality, productivity, and production cost of articles.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2014-226406 filed on Nov. 6, 2014, which is hereby incorporated by reference herein in its entirety.

What is claimed is:

1. A method of forming a pattern of an imprint material on a substrate using an imprint system, the method comprising:
   supplying the imprint material onto the substrate from a dispenser;
   curing the imprint material in a state in which a mold and the imprint material are in contact with each other; and
   obtaining information about a change of a result of an imprint process caused by a temporal change of at least one of the mold and the dispenser,
   wherein the imprint system performs the imprint process for forming the pattern of the imprint material on the substrate, and the imprint system includes:
   a processing unit configured to perform the imprint process for forming the pattern of the imprint material, the processing unit including the dispenser configured to supply a droplet of the imprint material onto the substrate;
   a library configured to manage a plurality of different distribution information, such that each of the plurality of different distribution information indicates at least one of a supply position and a supply amount for a droplet to be supplied on the substrate from the dispenser; and
   a control unit configured to select one distribution information to be used in the imprint process from among the plurality of different distribution information managed in the library based on the information.

2. The method according to claim 1, wherein the information includes at least one of a usage history of the mold, a usage history of the dispenser, and a detected change of a first parameter associated with the imprint process caused by the temporal change of at least one of the mold and the dispenser.

3. The method according to claim 2, wherein the control unit is configured to select the one distribution information based on an imprint condition when performing the imprint process and the detected change of the first parameter associated with the imprint process.

4. The method according to claim 3, wherein the imprint condition includes at least one of substrate in-plane distribution information including a distribution of an evaporation volume of the imprint material within a plane of the substrate and a distribution of an airflow within the plane of the substrate, and layout information of shot regions on the substrate.

5. The method according to claim 2, wherein the first parameter associated with the imprint process includes at least one of a line width, a residual layer thickness, and a number of defects of the pattern formed on the substrate.

6. The method according to claim 1, wherein the plurality of distribution information is generated based on a dimension of the pattern of the mold and a residual layer thickness of a pattern to be formed on the substrate.

7. The method according to claim 6, wherein the dimension of the pattern of the mold includes one of a design value of the pattern of the mold and an actually measured value of the pattern of the mold.

8. The method according to claim 6, wherein the plurality of distribution information is generated based on at least one of substrate in-plane distribution information including a distribution of an evaporation volume of the imprint material within a plane of the substrate and a distribution of an airflow within the plane of the substrate, and layout information of shot regions on the substrate.

9. The method according to claim 2, wherein each of the plurality of distribution information corresponds to each of a plurality of detected changes of the first parameter associated with the imprint process in a predicted range of change of the first parameter, the predicted range of change of the first parameter being predicted from the temporal change.

10. The method according to claim 1, wherein the imprint system further comprises a generation unit configured to generate the distribution information.

11. The method according to claim 10, wherein when a predicted range of change of the first parameter associated with the imprint process, which is predicted from the temporal change, varies from a first range to a second range, the control unit is configured to control the generation unit to generate distribution information in the second range, and to control the library to manage the distribution information in the second range that has been generated by the generation unit.

12. The method according to claim 11, wherein the control unit is configured to control the processing unit and the generation unit to perform in parallel the imprint process by the processing unit and generation of the distribution information in the second range by the generation unit.

13. The method according to claim 11, wherein the first range and the second range partially overlap each other.

14. The method according to claim 1, wherein the imprint system further comprises other processing units configured to respectively perform the imprint processes for forming the pattern of the imprint material, each of the other processing units including the dispenser configured to supply a droplet of the imprint material onto the substrate, and
wherein the control unit is configured to select one distribution information to be used in the imprint process from the plurality of distribution information managed in the library for each of the processing unit and the other processing units.

15. A method of performing an imprint process in which an imprint material on a substrate is cured in a state in which the imprint material and a mold are in contact with each other, the method comprising:
supplying, by a processing unit including a dispenser, a droplet of the imprint material onto a first region of the substrate from the dispenser and performing the imprint process in which the imprint material on the first region of the substrate is cured;
managing, in a library, a plurality of different distribution information, such that each of the plurality of different distribution information indicates at least one of a supply position and a supply amount for a droplet to be supplied on the substrate from the dispenser;
selecting, by a control unit, one distribution information to be used in the imprint process from the plurality of different distribution information managed in the library based on information about a change of a result of the imprint process caused by a temporal change of at least one of the mold and the dispenser; and
supplying a droplet of the imprint material onto a second region of the substrate, different from the first region of the substrate, from the dispenser according to the selected one distribution information and performing the imprint process in which the imprint material on the second region of the substrate is cured,
wherein each of the plurality of different distribution information indicates at least one of the supply position and the supply amount for the droplet on the substrate corresponding to each of a plurality of results within a range of the result of the imprint process in which a change is predicated from the temporal change.

16. A method of performing an imprint process in which an imprint material on a substrate is cured in a state in which the imprint material and a mold are in contact with each other, the method comprising:
supplying, by a processing unit including a dispenser, a droplet of the imprint material onto a first region of the substrate from the dispenser and performing the imprint process in which the imprint material on the first region of the substrate is cured;
managing, in a library, a plurality of different distribution information, such that each of the plurality of different distribution information indicates at least one of a supply position and a supply amount for a droplet to be supplied on the substrate from the dispenser;
selecting, by a control unit, one distribution information to be used in the imprint process from the plurality of different distribution information managed in the library based on information about a change of a result of the imprint process caused by a temporal change of the dispenser; and
supplying a droplet of the imprint material onto a second region of the substrate, different from the first region of the substrate, from the dispenser according to the selected one distribution information and performing the imprint process in which the imprint material on the second region of the substrate is cured.

17. A method of performing a process of curing a material on a substrate in a state in which the material and a member are in contact with each other, the method comprising:
supplying, by a processing unit including a dispenser, a droplet of the material onto a first region of the substrate from the dispenser and performing the process of curing the material on the first region of the substrate;
managing, in a library, a plurality of different distribution information, such that each of the plurality of different distribution information indicates at least one of a supply position and a supply amount for a droplet to be supplied on the substrate from the dispenser;
selecting, by a control unit, one distribution information to be used in the process from the plurality of different distribution information managed in the library based on information about a change of a result of the process caused by a temporal change of the dispenser; and
supplying a droplet of the material onto a second region of the substrate, different from the first region of the substrate, from the dispenser according to the selected one distribution information and performing the process of curing the material on the second region of the substrate.

18. The method according to claim 17, wherein each of the plurality of different distribution information indicates at least one of the supply position and the supply amount for the droplet on the substrate corresponding to each of a plurality of results within a range of the result of the process in which a change is predicated from the temporal change.

* * * * *